Figure 1:
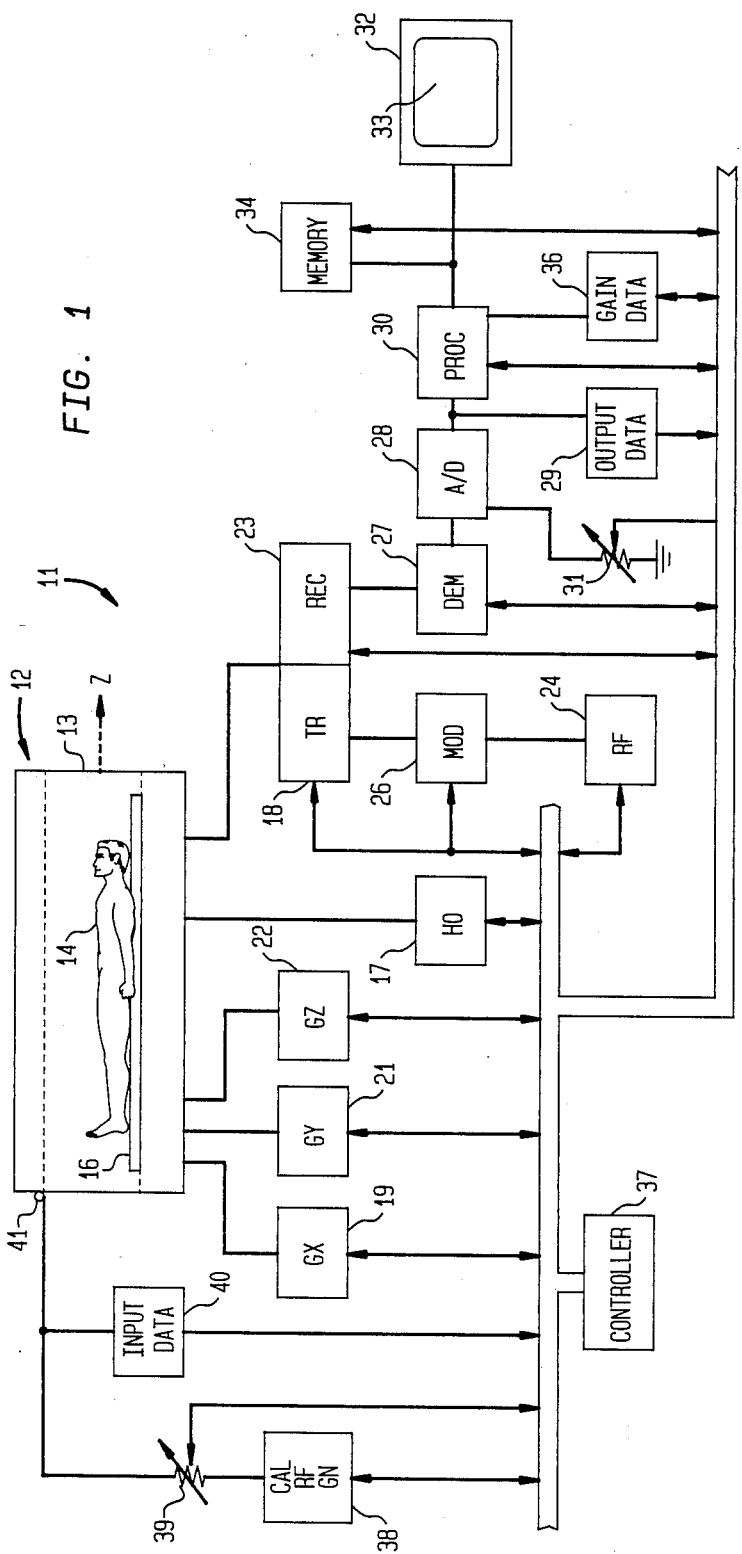

United States Patent [19]

Stokar

[11] Patent Number: 4,789,830

[45] Date of Patent: Dec. 6, 1988

[54] DETERMINING ABSOLUTE IMAGE INTENSITY IN MAGNETIC RESONANCE SYSTEMS

[75] Inventor: Saul Stokar, Raanana, Israel

[73] Assignee: Elscint Ltd., Haifa, Israel

[21] Appl. No.: 22,829

[22] Filed: Mar. 6, 1987

[30] Foreign Application Priority Data

Mar. 10, 1986 [IL] Israel .......................................... 78096

[51] Int. Cl.$^4$ ............................................. G01R 33/20
[52] U.S. Cl. ..................................... 324/308; 324/312
[58] Field of Search ............... 324/307, 308, 309, 310, 324/311, 312, 318, 322

[56] References Cited

U.S. PATENT DOCUMENTS 4,665,364 5/1987 Hanawa .............................. 324/308
4,700,138 10/1987 Shimazaki et al. .................. 324/322

OTHER PUBLICATIONS

P. C. Lauterbur, "Image Formation by Induced Local Interactions: Examples Empoying Magnetic Resonance", Nature, vol. 2 & 2, Mar. 16, 1973, pp. 190-191.

Primary Examiner—John Chapman
Assistant Examiner—Kevin D. O'Shea
Attorney, Agent, or Firm—Sandler & Greenblum

[57] ABSTRACT

A magnetic resonance (MR) system and method for determining absolute image intensities (MR numbers) comparable to "CT" numbers by removing the dependence of the intensity measurement on system dependent parameters. The dependence of the intensity measurement on system parameters is removed by determining the absolute gain of the receiver portion of the MR system. The absolute gain is a function of the loaded gain and the unloaded gain of the receiver system, the loaded gain is divided by the unloaded gain to provide a normalization factor which is multiplied by output data to provide the absolute values of intensity of absolute MR numbers.

17 Claims, 2 Drawing Sheets

DETERMINING ABSOLUTE IMAGE INTENSITY IN MAGNETIC RESONANCE SYSTEMS

FIELD OF THE INVENTION

This invention is concerned with magnetic resonance data acquisition systems and more particularly with the use of such systems for medical diagnostic imaging purposes.

BACKGROUND OF THE INVENTION

The phenomea of magnetic resonance has been used for a long time to obtain morphological data of biological specimens. More recently magnetic resonance has been used to obtain interior images of in-vivo biological specimens. The images were obtained after it was discovered that the magnetic gradients could be used to locate the source of the signals in magnetic resonance systems. For example, see the article in Nature (London) 242, 190 (1973) by P. C. Lauterbur.

As is well known magnetic resonance imaging uses a relatively strong static magnetic field having a given direction which is aligned with the Z axis of a cartesian coordinate system. The strong static magnetic field causes the nuclei of certain elements such as hydrogen to align with the field. Subsequently radio frequency pulses of sufficient amplitude and/or time duration are applied to nutate the aligned nuclei. The nutated nuclei precess about the Z axis. the rotational frequency of the Rf precession and the frequency of the Rf pulse is the Larmor frequency. The Larmor frequency is related to the strength of the static magnetic field and of the particular element whose nuclei are being nutated according to the equation:
where:

$$f = \gamma B_o / 2\pi$$

$\gamma$ is a constant depending on the element
$B_o$ is the strength of the magnetic field at the point of operation of the radio frequency pulse, and
$\pi$ is the constant 3.1416+

After the termination of the Rf pulse the nutated nuclei or spins tend to realign with the static magnetic field. Their movement toward realignment in the magnetic field generates Rf signals also having a Larmor frequency. These signals are known as free induction decay (FID) signals. It is these signals that are received to provide information on the proton density of the element that has been nutated by the Rf pulse.

There are many different methods used for obtaining the FID signals. Among the methods and probably one of the most popular methods at the present time is the spin echo method. These methods are all well known and will not elaborated on herein.

A problem occuring in all known methods of obtaining the effective proton densities with MR acquisition systems is that the intensities obtained are relative, i.e. there are not absolute image intensity figures obtained comparable to "CT" numbers in computerized tomography, for example. That is a unit nuclear magnetic resonance (NMR) signal broadcast by different objects will be detected with different intensities by the same NMR spectrometer. The source of these differences is the proximity of the NMR antenna to the source of the signal. This has the result that the antenna is affected differently (in terms of things such as dielectric coupling, capacitance, etc.) by different objects. Thus, although the same unit signal may be broadcast from the body of a person and from a doped water phantom, the antenna will respond differently to the two signals. In particular, the magnitude of the signals detected by the antenna will be different although the signals were the same when produced.

Magnetic resonance images display the effective proton density of a slice of the sample (patient). This effective proton density depends on two groups of parameters. The first group of parameters are subject dependent and includes such things as the actual density of the spins in the slice, the values of various other physical characteristics of the patient such as spin-lattice relaxation time T1, spin-spin relaxation time T2 and the decay time of the FID signal T*2 The second group of parameters are system dependent and includes such things as the gain of the receiving antenna system, the details of the reconstruction algorithm and the scale of the display system.

While the parameters of the first group have physical significance, the parameters of the second group have a large degree of arbitrariness. Since the parameters of the second group particularly the gain of the antenna (i.e. its response to a unit input signal) often change from scan-to-scan, the image intensity values change arbitrarily from scan to scan.

It is an object of the present invention to provide means for removing the dependence of the intensity on this second group of parameters and thus removing the arbitrariness from the measured image intensity value to thereby provide absolute image intensity values. Thus broadly speaking it is an object of the invention to assure that the measured intensity values are independent of the system parameters.

MRI system characteristics are such that each subject causes a different amount of loading on the Rf coils used for transmitting and receiving the Rf signals. Thus, the Rf signals that are received are not absolute signals but are relative signals. For example, more obese persons have a different loading factor than less obese persons.

There is no known method at the present time of co-relating the data obtained from the more obese person with that of the less obese person.

It has been suggested to use a water phantom in the magnet bore with the patient in order to set the gain of the system to obtain signals from the water for use in deriving absolute signal intensities. However, using such a water phantom in the bore with the patient raises the problem of how to properly locate the phantom. For example, if it is positioned below the table, supporting the patient, then it is in a position where the magnetic field is relatively inhomogenous. It is difficult to position the phantom within the center portion of the body coil which magnetically is the ideal position because that is where the patient is positioned. Thus, those skilled in the magnetic resonance imaging art are still seeking systems for calibrating the acquired data in order to standardize the data in a manner similiar to the standardization of CT data. Ideally such a system should not require any extra scan time.

BRIEF DESCRIPTION OF THE INVENTION

In accordance with the present invention an absolute image intensity magnetic resonance system is provided which includes radio frequency transmitting and receiving means, said system comprising:

means for determining the gain of the receiving means, means for generating a relatively large static magnetic field for aligning spins in a subject, means for transmitting Rf pulses for nutating said aligned spins, means for receiving Rf signals generated responsive to the motion of the nutated spins returning to the aligned position, means for processing said received Rf signals to provide relative intensity values or MR numbers as a function of the location of the Rf signals, means for determining the system gain, and means for using the determined system gain to determine the absolute intensity values or MR numbers from the relative MR numbers.

As another aspect of the invention, a magnetic resonance data acquisition system is provided having radio frequency transmitting and receiving means, said system comprising:

magnet means having a bore therein sufficiently large to receive a subject, said magnet means generating a relatively large static magnetic field for aligning spins in said subject, means for acquiring FID signals provided by a water phantom located in bore in the place of said subject, means for transmitting a radio frequency pulse of the proper frequency with the subject within the bore to provide a signal having the same value as the FID signal provided by the said water phantom, and means for adjusting the gain of the said receiving means when the system is loaded with the subject to provide said some signal value responsive to the same transmitted signal.

A feature of the invention uses means in the said system for obtaining the gain which comprise:

a calibrating antenna, a calibrating Rf generator means for providing a signal of the desired frequency to the antenna, and means for adjusting the amplitude of the signal to obtain the desired signal amplitude, said desired signal amplitude being equal to the signal provided by the phantom that was placed in the location in place of the subject.

A further feature of the invention comprises means for obtaining the gain of the magnetic resonance receiving means, and means for using the obtained gain to determine absolute MR numbers from relative MR numbers, said relative MR numbers obtained by processing said received Rf signals to provide the MR numbers as a function of location.

BRIEF DESCRIPTION OF THE DRWINGS

Figure 2:
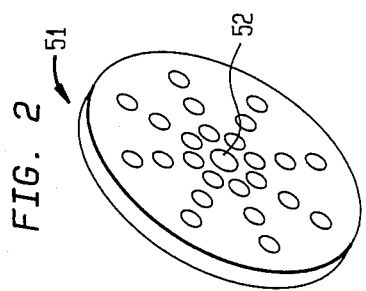
Figure 3:
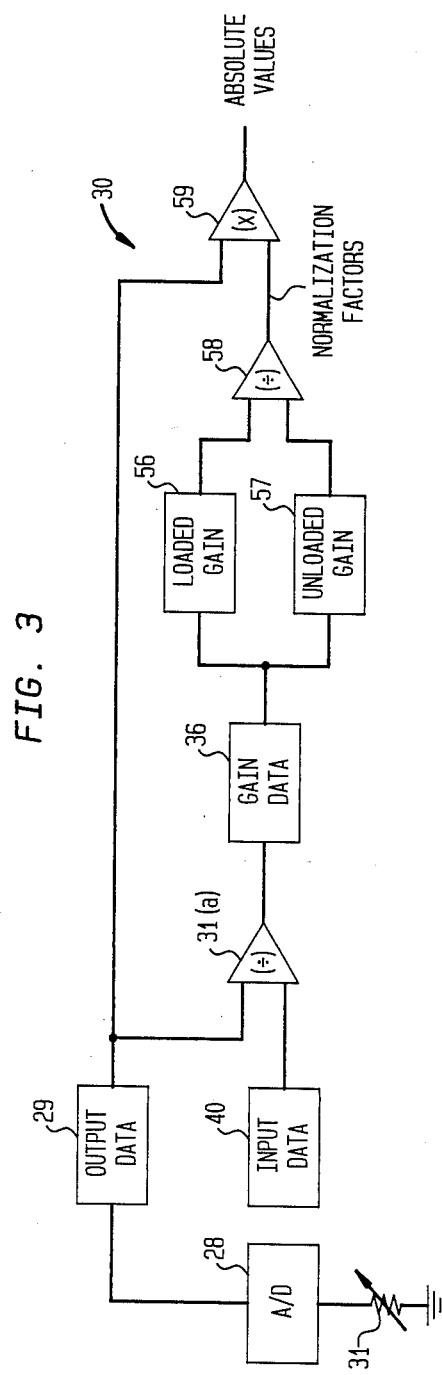

The above features and objects of the present invention will be better understood when considered in the light of the following description of a broad aspect of the invention made in conjunction with the accompanying drawings; wherein:

FIG. 1 shows an MRI system in block diagram from including the inventive absolute intensity determining arrangement, FIG. 2 is a showing of a phantom which could be used in calibrating the subject system, and FIG. 3 is a block diagram showing of a system for obtaining absolute image intensities.

GENERAL DESCRIPTION

The magnetic resonance imaging (MR) system 11 in FIG. 1 comprises a large magnet 12 for generating a relatively large static magnetic field, in the direction Z. The magnet 12 has a bore or tunnel 13 therein which is sufficiently large for a patient 14 to fit therein, on a moveable table 16. The MR system normally includes means such as magnetic field generator 17 for energizing the large magnet 12. Within the scope of the invention the magnet could be a resistance magnet, a permanent magnet or a superconducting magnet. In a preferred embodiment a superconducting magnet is used. However the invention is broad enough in scope to encompass whatever type of magnet is used.

Means are provided for nutating the spins aligned by the large magnet field. More particularly, transmitter 18 is shown. The transmitter is connected to magnet coils or probes (not shown) located within the tunnel. The probes induce and transmit Rf magnetic fields responsive to the radio frequency signals of the transmitter 18. The probes may use the same coils for receiving and for transmitting. Alternatively separate coils could be used for transmitting and for receiving the Rf signals. In any case probes are provided for use in transmitting pulses of Rf magnetic fields which nutate the spins to provide the free induction decay (FID) signals used in imaging.

Also shown are gradient generators shown as gradient generators 19, 21 and 22 used to generate the X, Y and Z gradients used in the scan sequences for providing the image data. The gradient generators provide gradient magnetic fields which enable locating the source of the FID signals.

A receiver is provided shown at 23 for receiving the signals induced in the probes responsive to the FID signals transmitted by the nutating spins. The transmitted Rf signals are typically supplied by an Rf generator shown at 24. The Rf signal may be shaped or modulated by a modulator 26 to provide the Rf signal pulses in a desired shape, for example.

In the receiving mode, the Rf signals are demodulated by demodulator 27 and then converted to digital form in analogue-digital converter 28. The output of the converter may be measured as indicated by output data block 29. The digital signals are then processed in processor 30. For example, the processor 30 may include a Fourier Transform operator which is used for converting the FID signals to location responsive signals.

In the preferred embodiment means are provided for varying the gain of the analog to digital amplifer. The means are shown as a grounded variable resistor 31, for example.

The digital data that is location oriented is used to provide the image 33 in the display means 32. Data may be stored in a memory shown at 34 for further processing, for example or for use when desired. The memory is generally divided into elemental sections which correspond to the pixels of the image. An aspect of this invention provides means for obtaining gain data from the analog to digital amplifier, the means for obtaining gain data includes a gain data store 36.

The system is controlled by a microprocessor or controller 37 which provides the time and amplitude controls for the scan sequence. The system of the invention works with any of the many scan sequences used for obtaining data for imaging purposes with magnetic resonance systems.

Means are provided for obtaining the absolute gain values of the system. More particularly a separate calibrating Rf generator is shown at 38. While a separate Rf generator is shown as being provided, Rf generator 24 could also be modified for use in this capacity.

Means are provided for controlling the outut amplitude of the calibrating Rf generator 38. This control is shown as the adjustable resistor 39. Means such input data block 40 is shown for measuring the amplitude of the calibrating Rf signal.

The output of the calibrating Rf generator is coupled to a calibrating antenna shown at 41. The calibrating antenna radiates the Rf signal provided by the Rf generator. The Rf signal is in turn received by the receiving coil, not shown, and is transmitted through the receiver, modulator, processor and the amplifier, to the gain data appartus 36. In other words it is transmitted through the receiving means. It is important that the antenna 41 be far enough from the patient so that it is not affected i.e. loaded by the patient.

Normally the calibrating Rf frequency of the generator is selected to be a desired frequency, for example the resonant frequency of hydrogen in the magnetic field; i.e., the Larmor frequency. The amplitude of the signal is selected to provide a desired signal at the output.

There are different ways which may be used for selecting the amplitude of the signal to the antenna 41. One way herein called a calibrating method is to provide a signal of a known value that will simulate FID signals. Another way is to provide an input signal that will provide a desired signal at the output of the A to D amplifier (converter).

In a preferred embodiment the calibration method of selecting the signal amplitude is used. According to the calibration method a phantom comprising a vial of water positioned at the center of the tunnel is used. A phantom 51 as shown in FIG. 2 having a plurality of vials containing water such as vial 52 arranged to cover the entire imaging volume may also be used. The signal amplitude of the Rf calibrating signal is adjusted until a signal is received at the output side of the amplifier that is equivalent to the FID signal or is a known function of the FID signal obtained from the water phantoms. The adjustment resistor 39 is then locked in this position. The output of the A/D converter may be measured at this time to be sure that in the future the same size input signal is used. The phantom must be small enough to avoid loading the system.

For purposes of explanation the variable resistor 39 is locked at a value designed to obtain a fixed input to antenna 41 which provides the desired output that is an output signal which equals the output signal obtained when using the water phantom located at the center of the magnet. This calibration is required only occasionally. When multiple vials are used then the output of the converter 28 for the vials not at the center is compared to the output of the vial at the center. The difference obtained are used to correct for inhomogeneties in the field. Similarly the phantom 51 can be moved lengthwise and data gathered for obtaining absolute intensities corrected for field inhomogeneities. Thus, the movement of the phantom and the different intensities acquired are easily converted to field inhomogeneity data as a function of location.

Normally, the patient is put into the tunnel 13 in the large static magnetic field and before any other tests are run a signal is transmitted from the calibrating Rf generator. The gain of the system is adjusted by the adjustable resistor 31 to obtain the same value at the output of A/D converter 28 as was obtained using the water phantom 51. In particular this ensures that if the patient was made completely of the substance contained in the water phantom the strength of the detected signal would be identical to that obtained from the phantom.

Alternatively a known signal can be placed into antenna 41 to obtain a measured value not related to water for the known signal. The gain of the system is obtained from the input and output signals without the subject in the bore. Immediately prior to any tests with the subject in the bore the gain is adjusted to provide the same output as was provided prior to the loading. Alternatively the gain adjustment can be left in a locked position and the relative input and output signal data before and after loading of the system with the subject can be used to calibrate the system gain.

As shown in FIG. 3, the processor 30 provides gain data. More particularly the output data of block 29 is divided by the input data of block 40 (after digitization) in the divider 31(a) of processor 30 The output of divider 31(a) provides the receiving system gain data as indicated at block 36. The gain data for the system in the loaded and in the unloaded conditions are indicated at blocks 56 and 57 respectively. The gains of blocks 56 and 57 are compared in division unit 58 by dividing the loaded gain by the unloaded gain to provide normalization factor numbers. The normalization factors are used to normalize the output of the converter 28 by multiplication of the converter output in unit 59 during the actual tests with the patient in the magnet. The output of unit 59 provides absolute intensity values.

Thus, what is provided is a means for obtaining absolute signal intensities for an MR system. The absolute intensity figures can be used to compare the tests between different individuals and in fact different slices of the same individual on an absolute basis. In addition proton density images can be provided.

While a system has been described using particular example, it should be recognized that this description is made by way of example only and not as a limitation on the scope of the invention, which scope is defined by the accompanying claims.

What is claimed is:

1. A magnetic resonance data acquisition system comprising:

magnet means for generating a relatively large static magnetic field for aligning spins in a subject in said system, means for transmitting Rf pulses for nutating said aligned spins, receiver means for receiving Rf signals generated by the nutated spins of the subject in the magnet means and of a phantom separately in the magnet means in the same location as the subject as the nutated spins return to the aligned position after termination of the Rf pulses, said receiver means having an output providing said received Rf signals, means for adjusting the output of said receiver means to provide received Rf signals from said phantom which conform to the phantom proton density, means for processing said Rf signals received from said subject to provide relative MR numbers as a function of location but uncorrected to absolute proton density and for subject loading, and means for determining an absolute gain of the receiver means to obtain absolute MR numbers from the relative MR numbers, said absolute MR numbers being normalized to absolute proton density and subject loading.

2. The magnetic resonance data acquisition system of claim 1 wherein said means for determining the absolute gain comprises:
a calibrating antenna,
means for providing calibrating Rf signals of a desired frequency to said calibrating antenna, and
means for adjusting the amplitude of the calibrating Rf signals to obtain a desired signal amplitude at the output of the receiver means,
said desired signal amplitude being equal to a signal provided by said phantom in the center of the magnet means.

3. The system of claim 2 including means for receiving said subject in the center of the magnet,
means for applying said calibrating Rf signals to said calibrating antenna with the subject in the magnet,
means for measuring the output amplitude of the Rf signals obtained responsive to calibrating Rf signals, being applied to said antenna, and said means for determining the absolute gain including means for adjusting the gain of said receiver means to cause the output amplitude of the Rf signals to equal the said desired signal amplitude whereby the gain of the receiver means is the absolute gain and the MR numbers are absolute MR numbers.

4. The system of claim 1 wherein said means for compensating for the loading comprises:
means for measuring the unloaded gain of the system without the subject in the system,
means for measuring the loaded gain of the system with the subject in the system,
means for determining a normalization factor from the loaded gain and the unloaded gain, and
means for normalizing the loaded gain to compensate for the loading and for obtaining absolute MR numbers.

5. The system of claim 4 including means for dividing the loaded gain by the unloaded gain to obtain the normalization factor and means for multiplying the loaded gain by the normalization factor.

6. The system of claim 1 including:
a calibrating antenna,
means for providing calibrating Rf signals of a desired frequency to said calibrating antenna,
means for maintaining the input of said calibrating Rf signal constant,
means for measuring the output of said receiver means with no subject in said magnet, and
means for adjusting the gain of said receiver means to cause the output of said receiver means to be substantially the same with a subject in the magnet and with no subject in the magnet, and
means for conducting the MR scan sequences to obtain image data with the adjusted gain.

7. The system of claim 2 wherein said calibrating antenna is sufficiently far from the subject to prevent loading of the antenna by the subject.

8. A magnetic resonance (MR) data acquisition method for an MR system including Rf transmitting and receiving means, said method comprising the steps of:
generating a relatively large static magnetic field for aligning spins in a subject in said system,
transmitting Rf pulses for nutating said aligned spins,
receiving Rf signals generated by the nutated spins as the nutated spins return to the aligned position after termination of the Rf pulses,
processing said received Rf signals to provide relative MR numbers as a function of location, and
determining an absolute gain of said receiver means to obtain absolute MR numbers from the relative MR numbers.

9. The magnetic resonance data acquisition method of claim 8 including the steps of:
providing calibrating Rf signals of a desired frequency for receipt by said receiving means in said MR system,
adjusting the amplitude of the calibrating Rf signals to obtain a desired signal amplitude at the output of the receiving means,
said desired signal amplitude being equal to a signal provided by a phantom in the center of the magnet field.

10. The method of claim 9 including the step of receiving a subject in the center of the magnetic field,
applying said calibrating Rf signals with the subject in the magnetic field,
measuring the output amplitude of the Rf signals obtained responsive to said applied calibrating Rf signals, and
determining the absolute gain of the system including adjusting the gain of said receiving means to cause the output amplitude of the Rf signals to equal the said desired amplitude whereby the gain of the system is the absolute gain and the MR numbers are absolute MR numbers.

11. The method of claim 8 wherein said step of determing an absolute gain comprises compensating for the loading of the system by the subject.

12. The method of claim 11 wherein said step of compensating for the loading comprises:
measuring the unloaded gain of the sytem without the subject in the system,
measuring the loaded gain of the system with the subject in the system,
determining a normalization factor from the loaded gain and the unloaded gain, and
normalizing the loaded gain to compensate for the loading and for obtaining absolute MR numbers.

13. The method of claim 12 including dividing the loaded gain by the unloaded gain to obtain the normalization factor, and multiplying the loaded gain by the normalization factor.

14. The method of claim 8 including:
providing calibrating Rf signals of a desired frequency to said MR system,
maintaining the input of said calibrating Rf signal constant,
measuring the output of said receiving means with no subject in said magnet field, and
adjusting the gain of said receiving means to cause the output of said receiving means to be substantially the same with a subject in the magnetic field and with no subject in the magnetic field, and
conducting the MR scan sequences to obtain image data with the adjusted gain.

15. The method of claim 9 including maintaining the antenna source of the calibrating Rf signals sufficiently far from the subject to prevent loading of the antenna by the subject.

16. The method of claim 9 including using said phantom to measure absolute field inhomogenieties.

17. The method of claim 1 including maintaining the antenna source of the calibrating RF signals sufficiently far from the subject to prevent loading of the antenna by the subject.

* * * * *